US008577489B2

(12) United States Patent
Bruce et al.

(10) Patent No.: US 8,577,489 B2
(45) Date of Patent: Nov. 5, 2013

(54) DIAGNOSING IN-LINE CRITICAL DIMENSION CONTROL ADJUSTMENTS USING OPTICAL PROXIMITY CORRECTION VERIFICATION

(75) Inventors: James A. Bruce, Williston, VT (US); Kenneth T. Settlemyer, Jr., Bradenton, FL (US)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 13/014,152

(22) Filed: Jan. 26, 2011

(65) Prior Publication Data
US 2012/0191234 A1    Jul. 26, 2012

(51) Int. Cl.
*G06F 19/00* (2011.01)

(52) U.S. Cl.
USPC ............ 700/110; 700/103; 700/121; 703/13; 703/14

(58) Field of Classification Search
USPC ................. 700/103, 110, 121; 703/13, 14
See application file for complete search history.

(56) References Cited

U.S. PATENT DOCUMENTS

| | | | |
|---|---|---|---|
| 5,800,951 A | 9/1998 | Hashimoto | |
| 6,067,375 A | 5/2000 | Tsudaka | |
| 6,106,980 A | 8/2000 | Pierrat et al. | |
| 6,187,687 B1 * | 2/2001 | Plat et al. | 438/724 |
| 6,415,421 B2 | 7/2002 | Anderson et al. | |
| 6,425,117 B1 * | 7/2002 | Pasch et al. | 716/53 |
| 6,600,551 B2 * | 7/2003 | Cooper et al. | 355/53 |
| 6,606,533 B1 | 8/2003 | Whiting | |
| 6,665,856 B1 | 12/2003 | Pierrat et al. | |
| 6,766,507 B2 | 7/2004 | Bruce et al. | |
| 6,888,616 B2 * | 5/2005 | Cooper et al. | 355/53 |
| 6,952,818 B2 | 10/2005 | Ikeuchi | |
| 7,065,738 B1 | 6/2006 | Kim | |
| 7,093,229 B2 | 8/2006 | Pang et al. | |
| 7,114,145 B2 | 9/2006 | Ye et al. | |
| 7,233,887 B2 | 6/2007 | Smith | |
| 7,245,356 B2 | 7/2007 | Hansen | |
| 7,264,906 B2 | 9/2007 | Croffie et al. | |
| 7,281,222 B1 | 10/2007 | Babcock | |

(Continued)

FOREIGN PATENT DOCUMENTS

JP    2009139632 A    6/2009

OTHER PUBLICATIONS

Rodrigues, et al., "Optical Lithography Simulation with Focus Variation using Wavelet Transform", IEEE 2010.

(Continued)

*Primary Examiner* — Michael D Masinick
(74) *Attorney, Agent, or Firm* — Katherine S. Brown; Hoffman Warnick LLC

(57) ABSTRACT

Solutions for diagnosing in-line critical dimension control adjustments in a lithographic process are disclosed. In one embodiment, a method includes: locating a control structure in a data set representing one of a chip or a kerf; simulating component dimensions within a region proximate to the control structure; determining a difference between the simulated component dimensions within the region and target component dimensions within the region; determining whether the difference exceeds a predetermined tolerance threshold; adjusting a simulation condition in response to determining the difference exceeds the predetermined tolerance threshold; and repeating the simulating of the component dimensions within the region, the determining of the difference, and the determining of whether the difference exceeds the predetermined tolerance threshold in response to the adjusting of the simulation condition.

19 Claims, 5 Drawing Sheets

(56) References Cited

U.S. PATENT DOCUMENTS

| | | | |
|---|---|---|---|
| 7,318,214 B1 | 1/2008 | Prasad et al. | |
| 7,325,222 B2 | 1/2008 | Strelkova et al. | |
| 7,350,183 B2 * | 3/2008 | Cui et al. | 716/52 |
| 7,383,530 B2 | 6/2008 | Wang et al. | |
| 7,480,890 B2 | 1/2009 | Hsiao | |
| 7,587,704 B2 | 9/2009 | Ye et al. | |
| 7,617,477 B2 | 11/2009 | Ye et al. | |
| 7,624,369 B2 | 11/2009 | Graur et al. | |
| 7,646,906 B2 | 1/2010 | Saidin et al. | |
| 7,689,966 B2 | 3/2010 | Verma et al. | |
| 7,694,267 B1 | 4/2010 | Ye et al. | |
| 7,695,876 B2 | 4/2010 | Ye et al. | |
| 7,752,595 B2 | 7/2010 | Maeda et al. | |
| 7,805,699 B2 | 9/2010 | Kusnadi et al. | |
| 8,014,991 B2 * | 9/2011 | Mitrovic et al. | 703/13 |
| 8,057,967 B2 | 11/2011 | Ye et al. | |
| 8,200,468 B2 * | 6/2012 | Ye et al. | 703/13 |
| 2003/0219154 A1 | 11/2003 | Medvedeva et al. | |
| 2004/0268291 A1 | 12/2004 | Alvarez-Gomariz et al. | |
| 2005/0055658 A1 | 3/2005 | Mukherjee et al. | |
| 2007/0031745 A1 | 2/2007 | Ye et al. | |
| 2007/0113216 A1 | 5/2007 | Zhang | |
| 2007/0292778 A1 * | 12/2007 | Bang et al. | 430/30 |
| 2008/0204690 A1 | 8/2008 | Berger et al. | |
| 2009/0031262 A1 | 1/2009 | Maeda et al. | |
| 2009/0100389 A1 | 4/2009 | Kusnadi et al. | |
| 2009/0132992 A1 | 5/2009 | Zhou et al. | |
| 2009/0157360 A1 * | 6/2009 | Ye et al. | 703/2 |
| 2009/0246975 A1 * | 10/2009 | Lin et al. | 438/795 |
| 2010/0122225 A1 | 5/2010 | Cao et al. | |
| 2010/0162197 A1 | 6/2010 | Ye et al. | |
| 2010/0175042 A1 | 7/2010 | Tirapu Azpiroz et al. | |
| 2010/0180251 A1 | 7/2010 | Ye et al. | |
| 2012/0191234 A1 | 7/2012 | Bruce et al. | |

OTHER PUBLICATIONS

Sturtevant et al., "Novel Method for Optimizing Lithography Exposure Conditions using Full-Chip Post-OPC Simulation", Optical Microlithography XXI, 2008.

Jank et al., "Method for fast and accurate calibration of litho simulator for hot spot analysis", PE-82.

Anderson et al., "Optimizing process window robustness with reconfigurable OPC (reconfigurable optical proximity correction)", Solid State Technology 2006.

Ban et al., "A Fast Lithography Verification Framework for Litho-Friendly Layout Design", Proceedings of the Sixth International Symposium on Quality Electronic Design, 2005.

Word et al., "Lithography yield enhancement through optical rule checking", Advanced Microlithography Technologies, 2005.

Hung et al., "Post-OPC verification using a full-chip Pattern-Based simulation verification method", 25th Annual BACUS Symposium on Photomask Technology, 2005.

Lin: U.S. Appl. No. 13/014,159, filed Jan. 26, 2011, Notice of Allowance, Jan. 11, 2013, 5 pgs.

Lin: U.S. Appl. No. 13/014,159, filed Jan. 26, 2011, *ExParteQuayle*, Oct. 12, 2012, 14 pgs.

Lucas, et al., Patterning control budgets for the 32nm generation incorporating lithography, design, and RET variations, Optical Microlithography XX, Proc. of SPIE, vol. 6520, 65200N, 2007.

Zach et al., "Process dependencies of Optical Proximity Corrections", Optical Microlithography XIV, Proceedings of SPIE vol. 4346, 2001.

Riddle: U.S. Appl. No. 12/953,511, Office Action Mar. 1, 2013, 24pages.

* cited by examiner

DIAGNOSING IN-LINE CRITICAL DIMENSION CONTROL ADJUSTMENTS USING OPTICAL PROXIMITY CORRECTION VERIFICATION

CROSS-REFERENCE TO RELATED APPLICATIONS

The current application is related in some aspects to U.S. patent application Ser. No. 13/014,159, filed on Jan. 26, 2011 which is hereby incorporated by reference.

BACKGROUND OF THE INVENTION

The subject matter disclosed herein relates to diagnosing in-line critical dimension control adjustments. More specifically, the subject matter disclosed herein relates to using optical proximity correction verification (OPCV) to account for in-line critical dimension control adjustments.

OPCV simulations are most accurate when lithographic in-line conditions are run at the same conditions as used during the processing of wafers for model building. However, it is common in conventional approaches for the line to control the lithography conditions such that a specific structure (e.g., a control structure) is printed at a target critical dimension (CD). In these cases, it is not unusual for the conditions of the line to differ from the conditions of the OPCV simulations, for example, because of process drifts over time, because the initial model was not properly anchored to the structure used to control the manufacturing line, or because there is a desire for the target of the process to be increased or decreased for electrical or yield performance reasons. For example, the in-line target CD (and thus, the exposure dose used) may drift over time due to, e.g., feedback from the test structure. Therefore, the pass/fail criteria may not accurately predict fails in-line.

Two conventional approaches to addressing this issue exist. The first approach involves ignoring the dose differences between the in-line target CD and the OPCV simulations. This approach, however, may create inaccuracies in prediction of the lithography. The second approach involves continually updating the production code to reflect changes in the in-line dose from the time the model was built through the time of OPCV simulation. However, this approach can introduce error in the lithography, because the dose setting used may not reflect the true dose applied, due to issues such as dose calibration, reflectivity, thin film interference, etc.

BRIEF SUMMARY OF THE INVENTION

Solutions for diagnosing in-line critical dimension control adjustments in a lithographic process are disclosed. In one embodiment, a method includes: locating a control structure in a data set representing one of a chip or a kerf; simulating component dimensions within a region proximate to the control structure; determining a difference between the simulated component dimensions within the region and target component dimensions within the region; determining whether the difference exceeds a predetermined tolerance threshold; adjusting a simulation condition in response to determining the difference exceeds the predetermined tolerance threshold; and repeating the simulating of the component dimensions within the region, the determining of the difference, and the determining of whether the difference exceeds the predetermined tolerance threshold in response to the adjusting of the simulation condition.

A first aspect includes a computer-implemented method of diagnosing in-line critical dimension control adjustments in a lithographic process, the method comprising: locating a control structure in a data set representing one of a chip or a kerf; simulating component dimensions within a region proximate to the control structure; determining a difference between the simulated component dimensions within the region and target component dimensions within the region; determining whether the difference exceeds a predetermined tolerance threshold; adjusting a simulation condition in response to determining the difference exceeds the predetermined tolerance threshold; and repeating the simulating of the component dimensions within the region, the determining of the difference, and the determining of whether the difference exceeds the predetermined tolerance threshold in response to the adjusting of the simulation condition.

A second aspect includes a computer system comprising: at least one computing device configured to diagnose in-line critical dimension control adjustments in a lithographic process by performing actions comprising: locating a control structure in a data set representing one of a chip or a kerf; simulating component dimensions within a region proximate to the control structure; determining a difference between the simulated component dimensions within the region and target component dimensions within the region; determining whether the difference exceeds a predetermined tolerance threshold; adjusting a simulation condition in response to determining the difference exceeds the predetermined tolerance threshold; and repeating the simulating of the component dimensions within the region, the determining of the difference, and the determining of whether the difference exceeds the predetermined tolerance threshold in response to the adjusting of the simulation condition.

A third aspect includes a computer program comprising program code embodied in at least one computer-readable storage medium, which when executed, enables a computer system to diagnose in-line critical dimension control adjustments in a lithographic process, the method comprising: locating a control structure in a data set representing one of a chip or a kerf; simulating component dimensions within a region proximate to the control structure; determining a difference between the simulated component dimensions within the region and target component dimensions within the region; determining whether the difference exceeds a predetermined tolerance threshold; adjusting a simulation condition in response to determining the difference exceeds the predetermined tolerance threshold; and repeating the simulating of the component dimensions within the region, the determining of the difference, and the determining of whether the difference exceeds the predetermined tolerance threshold in response to the adjusting of the simulation condition.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

DETAILED DESCRIPTION OF THE INVENTION

Figure 1:
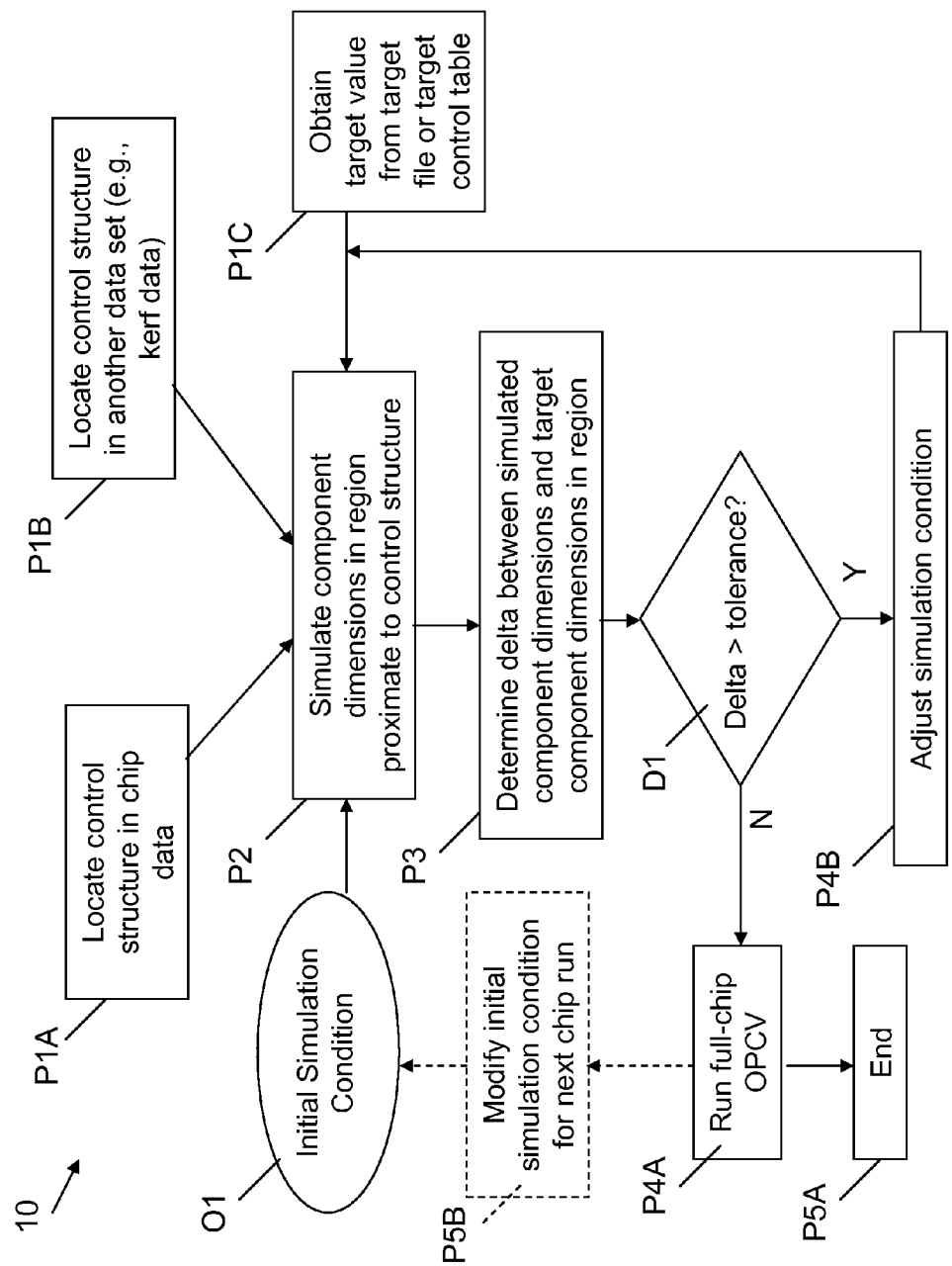
FIG. 1 shows a flow diagram depicting a method according to embodiments.

It is noted that the drawings of the invention are not to scale. The drawings are intended to depict only typical aspects of the invention, and therefore should not be considered as limiting the scope of the invention. In the drawings, like numbering represents like elements between the drawings.

As indicated herein, embodiments disclosed relate to accounting for in-line critical dimension control adjustments using optical Proximity correction verification (OPCV). More specifically, embodiments disclosed relate to an iterative process including: simulating lithography of a control structure using initial process conditions (i.e., those starting process conditions which constitute the original centerpoint of model build data) to determine a simulated critical dimension at the control structure; comparing the simulated critical dimension with a target critical dimension chosen based upon how the production line desires to run the lithography process in question; and iteratively modifying lithography simulation conditions (e.g., dose, focus, etc.) to retarget the simulation of the critical dimension. After iterating to find lithography simulation conditions that match the simulation to the target, conventional OPCV methods may be used according to the modified conditions with the new centerpoint of the process determined by the modified simulation.

In one embodiment, a method is disclosed including the following processes: a) locating a control structure in a data set representing one of a chip or a kerf; b) simulating component dimensions within a region proximate to the control structure; c) determining a difference between the simulated component dimensions within the region and target component dimensions within the region; d) determining whether the difference exceeds a predetermined tolerance threshold; e) adjusting a target lithography simulation condition in response to determining whether (and by how much) the difference exceeds the predetermined tolerance threshold; f) repeating the simulating of the component dimensions within the region, using the updated lithography conditions, and g) running full-chip OPCV using the lithography simulation condition iteratively defined in steps (e) and (f).

As used herein, the terms "data", "chip data", "chip layout data" and "layout data" may be used interchangeably to refer to data representing the physical layout of one or more integrated circuit chips on a wafer.

Turning to FIG. 1, a flow chart 10 illustrating a method according to embodiments is disclosed. As shown, in one embodiment, process P1A includes locating a control structure in chip data (e.g., chip layout data). That is, process P1A may include locating a process control structure for a wafer, which may include a plurality of integrated circuit chips and kerfs (separation regions) between those chips on the wafer. In an alternative embodiment, process P1B may be performed, where this process includes locating a control structure in a data set other than chip data. In this case, a control structure may be located in a kerf area (spacing between chips on the wafer), or in other chips from the same reticle (in the case where OPC verification is done on a chip-by-chip basis instead on a merged reticle data set).

In process P2, using the control structure identified in either the chip data or e.g., the kerf data, component dimensions are simulated in a region proximate to the control structure. That is, process P2 includes simulating the manufacture of components within a defined region around the control structure. For example, this may include simulating line ends, spacings, etc. in the region around the control structure (as well as the control structure itself). It is understood that in order to perform the simulation in process P2, target values representing target dimensions, spacings, etc. of the components within the region are obtained (in process P1C) from, e.g., a target data file or an in-line target control table, etc. as is known in the art. It is further understood that the target values (target control structure values) may be stored in, e.g., a data library, either after optical proximity correction (OPC), or by layer and technology type before OPC. It is additionally understood that in order to perform the simulation in process P2, initial (lithography) simulation conditions (data object O1) are used as inputs to the simulator. These initial (lithography) simulation conditions may include exposure dose, focus, and other lithography conditions known in the art. As will be described further herein, iteration of process P2 may involve modification of these initial lithography simulation conditions prior to re-simulation.

Following simulation in process P2, process P3 includes determining a difference (delta) between the simulated component dimensions and target component dimensions (as obtained in process P1C) within the defined region. In decision D1, the delta is compared to a predetermined tolerance (e.g. a tolerance band) to determine whether the target or the initial lithography simulation conditions require modification. It is understood that as the simulation process (P2) may be run for a plurality of features, distinct predetermined tolerance bands may be used corresponding to each of the plurality of features.

In the case that the delta does not exceed a predetermined tolerance band (No, to decision D1), process P4A includes running optical proximity correction verification (OPCV) on the full-chip data. Running OPCV (or, optical rule checking, ORC) on the full-chip data according to the target lithography conditions (obtained in P1C) may be performed according to conventional methods known in the art. Accordingly, description of OPCV is omitted here for brevity. It is understood that in an optional embodiment, after running traditional OPCV on the full-chip data (process P4A), modification of the initial lithography simulation conditions (object O1) for a subsequent chip simulation run may be performed in process PSB, according to known methods.

In the case that the delta exceeds the predetermined tolerance band (Yes to D1), in process P4B, the lithography simulation condition (e.g., dose, focus, etc.) is adjusted in an attempt to reduce the delta value to within the tolerance band. That is, in process P4B, the initial target value obtained in process P1C may be modified according to the adjusted simulation lithography conditions, and subsequently, simulation of component dimensions (process P2) may be repeated with the modified simulation lithography conditions.

Figure 2:
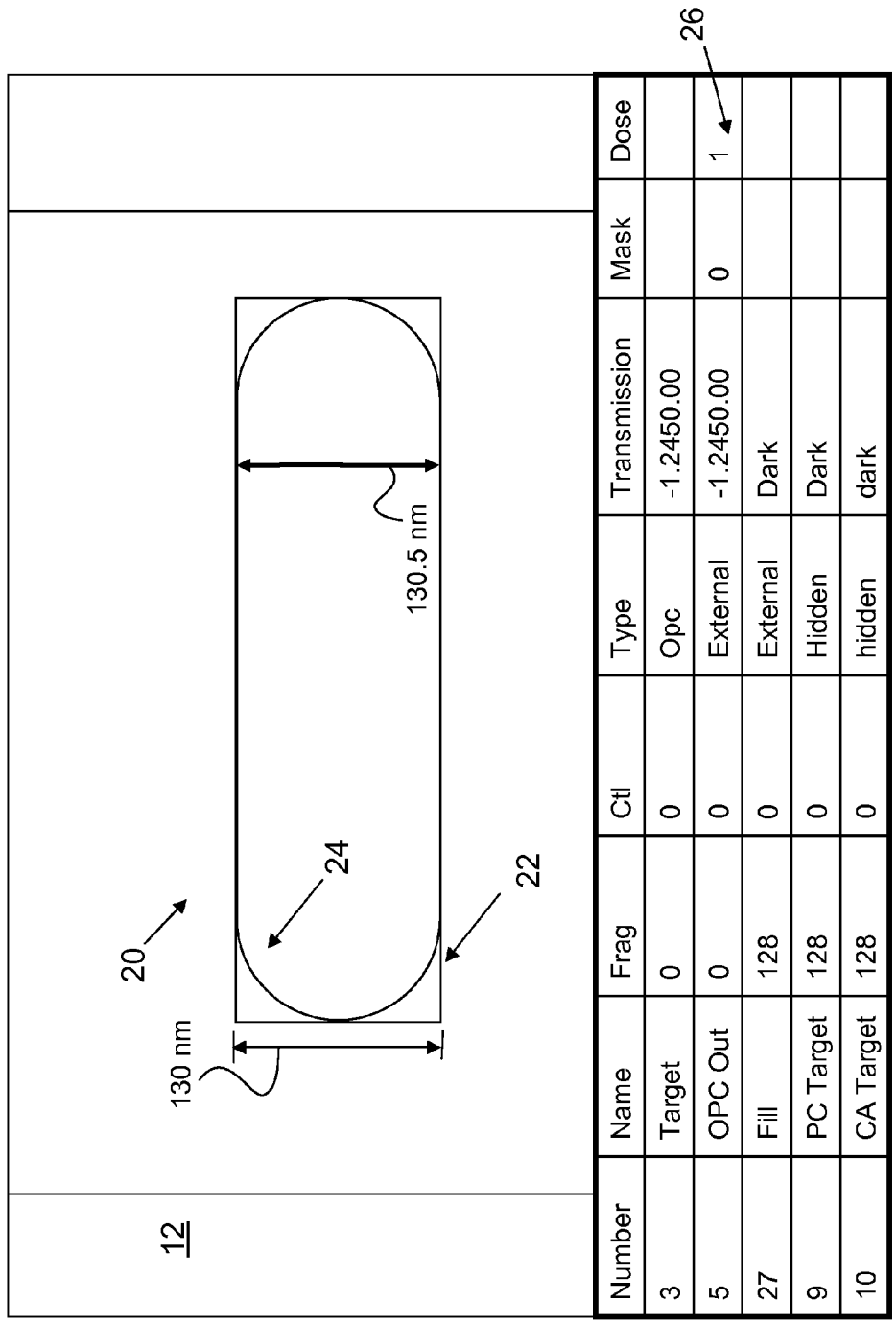
FIGS. 2-4 show schematic views of user interfaces according to embodiments.
Figure 3:
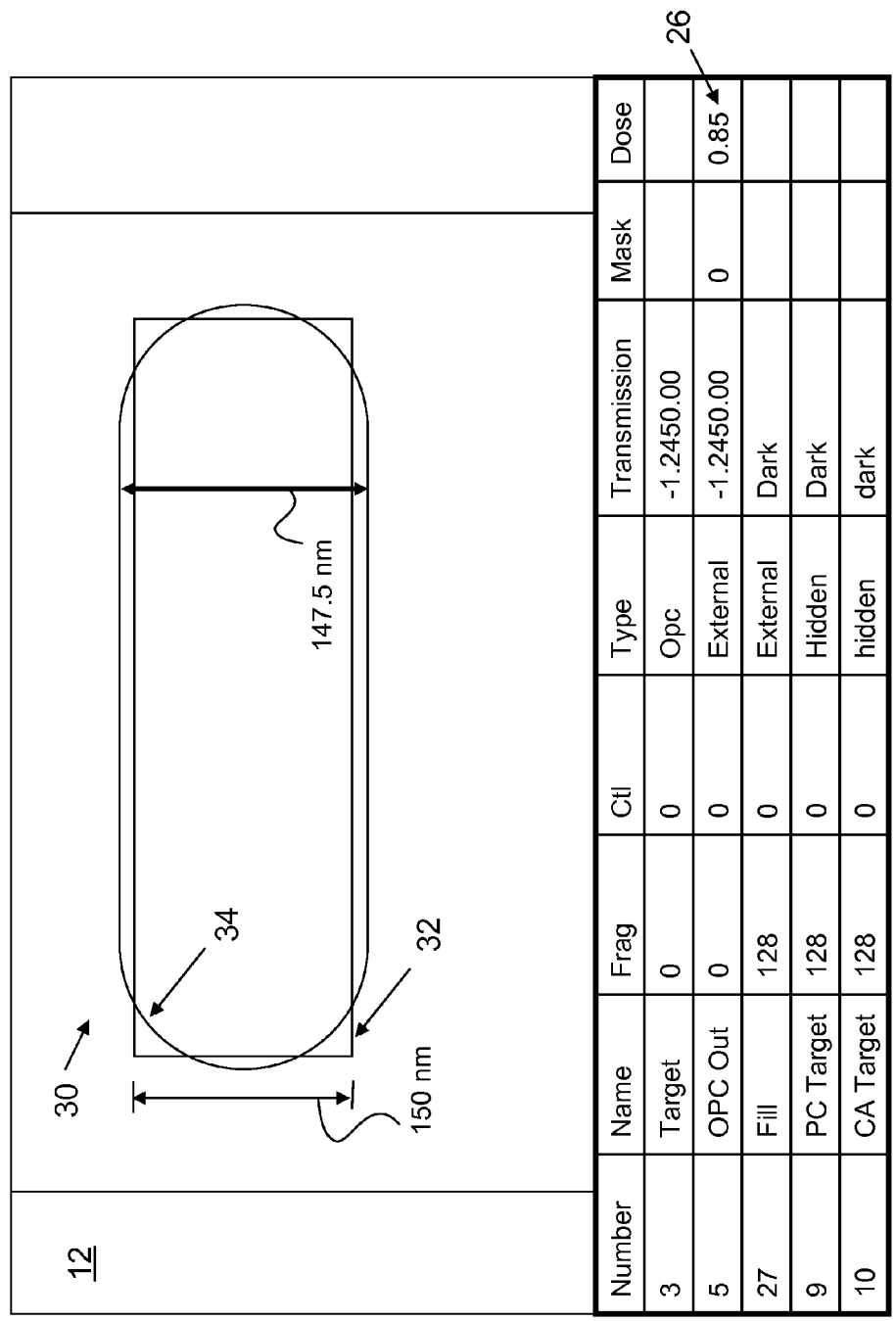
Figure 4:
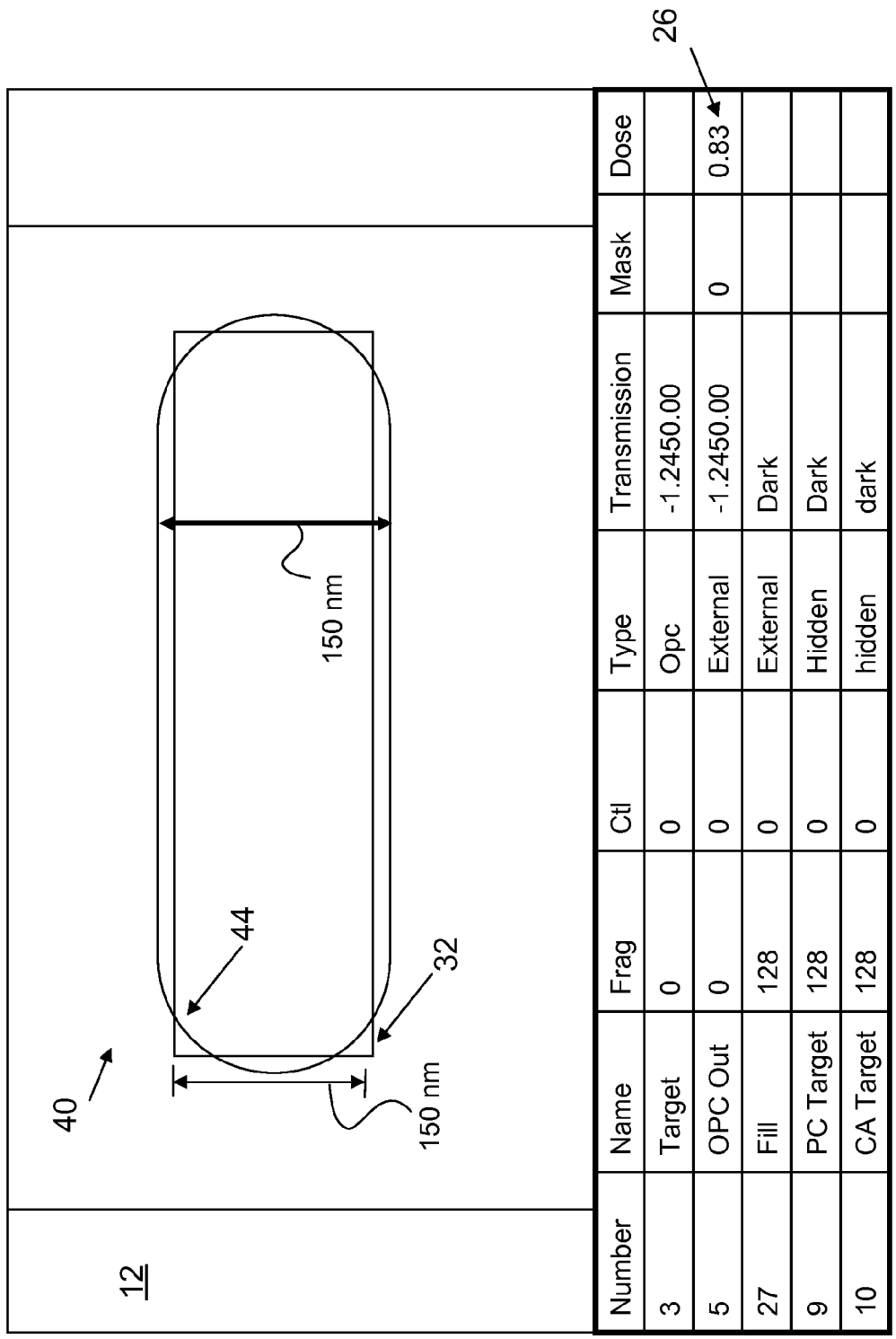

FIGS. 2-4 show example structures and conditions illustrated according to embodiments disclosed herein. That is, FIGS. 2-4 are intended merely to illustrate some of the processes described herein, and should not be thought of as limiting the scope of those processes. Further, it is understood that FIGS. 2-4 may depict later-stage simulation processes after initial simulation and modification has occurred.

FIG. 2 shows a user interface 12 illustrating a simulation 20 of a portion a static random access memory (SRAM) structure during an intermediate simulation process. This simulation 20 includes a design target dimension (e.g., a spacing between components) 22, as presented in the original design data, and a simulated actual dimension 24 (simulated after OPC), which may deviate in some part from the design target dimension 22. In this case, design target dimension 22 is equal to 130 nanometers (nm). As shown, in this time in the simulation process (e.g., at iteration number 3 in a process of 5 iterations), simulated actual dimension 24 is measured at 130.5 nm. Where this deviation is within a tolerance band (as in this case, with a deviation of 0.005 nm from target), it shows that the original design target dimension 22 is accurate with respect to the simulation. As shown in user interface 12, simulation controls 26 at this time in the simulation process are set to a dose level of 1.0.

FIG. 3 shows the user interface 12 of FIG. 2, including an additional simulation 30 of the static random access memory structure of FIG. 2 factoring in the manufacturing line target. It is understood that adjustments made to the simulation conditions in these examples (e.g., in dose) may be performed according to a predetermined adjustment criteria or assumptions based upon known targets. For example, in the illustrative example shown and described with reference to FIGS. 2-4, it is understood that decreasing the dose (e.g., from 1.0 to 0.85, and subsequently, to 0.83) is known to bring the simulated actual dimensions closer to the original design target dimensions. Further, beyond knowing whether to increase or decrease the dose, it is understood that the amount of adjustment may be performed according to the predetermined adjustment criteria or assumptions based upon known targets.

Returning to FIG. 3, simulation 30 shows the manufacturing line target 32, which is equal to 150 nm. That is, the width of the component is targeted to be 150 nm. In this case, manufacturing line target 32 will differ from the original design target (22, FIG. 2) by 20 nanometers to accommodate for, e.g., process biases, such as the bias from lithography to reactive ion etching (RIE). Due to the differences between manufacturing line target 32 and original design target 22 (FIG. 2), simulation may be performed again to account for these manufacturing line target differences. The result, in this case, is a simulated actual dimension 34, having a spacing of 147.5 nm. As shown in user interface 12, simulation controls 26 are set to a dose level of 0.85 in order to account for the manufacturing line target differences from the original design. In this case, the difference of 2.5 nm may be outside of the predetermined tolerance band (e.g., as described with reference to FIG. 1), and therefore, an adjustment to a lithography condition (e.g., dose) may help improve the simulation in this iterative process.

FIG. 4 shows the user interface 12 of FIG. 3, including an iterative simulation 40 of the simulation 30 of FIG. 3. That is, FIG. 4 illustrates repeating the simulation of spacing (target 32) according to embodiments. In this case, simulation 40 shows that the second iteration produces a simulated actual dimension 44 of 150 nm, which is within the predetermined tolerance for manufacturing line target 32 (set at 150 nm). As shown in user interface 12, simulation controls 26 have been modified to a dose level of 0.83 in order to improve the simulation from the first iteration shown and described with reference to FIG. 3. It is understood that once the simulation falls within the predetermined tolerance, full chip OPCV may be run (process P4A), which may identify other areas of a layout that aspects of the invention may improve.

It is understood that the examples of FIGS. 2-4 are merely illustrative of a simple iteration scenario at a particular simulation stage, and are in no way limiting of the teachings described herein. In some cases, several iterations or more may be necessary to improve the accuracy of the simulations described herein. It is further understood that while the dose is described as being modified in the examples of FIGS. 2-4, focus and/or other lithographic conditions may be modified in order to improve the accuracy of simulations according to embodiments.

Figure 5:
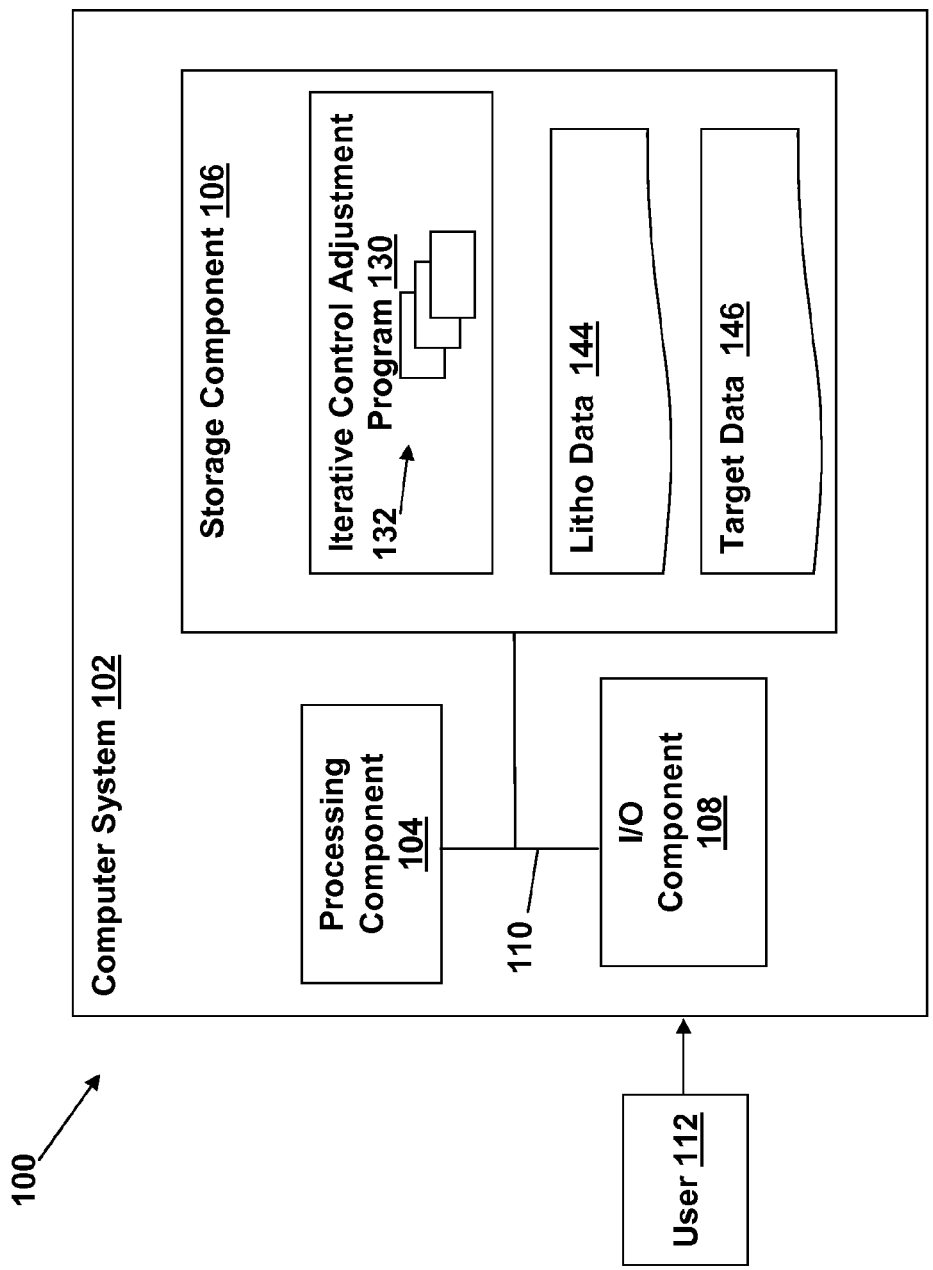
FIG. 5 shows an illustrative environment for diagnosing in-line critical dimension control adjustments according to embodiments.

FIG. 5 depicts an illustrative environment 100 for diagnosing in-line critical dimension control adjustments according to an embodiment. To this extent, the environment 100 includes a computer system 102 that can perform a process described herein in order to generate a cut mask in an integrated circuit design. In particular, the computer system 102 is shown as including a lithography set point location program 130, which makes computer system 102 operable to handle diagnosing in-line critical dimension control adjustments by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the iterative control adjustment program 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the lithography set point location program 130 can manage a set of interfaces (e.g., graphical user interface(s), application program interface, etc.) that enable human and/or system users 112 to interact with the iterative control adjustment program 130. Further, the iterative control adjustment program 130 can manage (e.g., store, retrieve, create, manipulate, organize, present, etc.) data, such as lithography data 144 (e.g., initial litho conditions, object O1, FIG. 1), and/or target data 146 (e.g., target values obtained from target file(s) or target control table(s)), etc., using any solution.

In any event, the computer system 102 can comprise one or more general purpose computing articles of manufacture (e.g., computing devices) capable of executing program code, such as the iterative control adjustment program 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the lithography set point location program 130 can be embodied as any combination of system software and/or application software.

Further, the iterative control adjustment program 130 can be implemented using a set of modules 132. In this case, a module 132 can enable the computer system 102 to perform a set of tasks used by the iterative control adjustment program 130, and can be separately developed and/or implemented apart from other portions of the iterative control adjustment program 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of iterative control adjustment program 130 fixed thereon (e.g., one or more modules 132). However, it is understood that the computer system 102 and iterative control adjustment program 130 are only representative of various possible equivalent computer systems that may perform a process described herein. To this extent, in other embodiments, the functionality provided by the computer system 102 and iterative control adjustment program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as post-lithography data 144 (e.g., initial litho conditions, object O1, FIG. 1), and/or target data 146 (e.g., target values obtained from target file(s) or target control table(s)) using any solution. For example, the computer system 102 can generate and/or be used to generate lithography data 144 and/or target data 146, retrieve lithography data 144 and/or target data 146, from one or more data stores, receive lithography data 144 and/or target data 146, from another system, send lithography data 144 and/or target data 146 to another system, etc.

While shown and described herein as a method and system for diagnosing in-line critical dimension control adjustments, it is understood that aspects of the invention further provide various alternative embodiments. For example, in one embodiment, the invention provides a computer program fixed in at least one computer-readable medium, which when executed, enables a computer system to diagnosing in-line critical dimension control adjustments. To this extent, the computer-readable medium includes program code, such as the iterative control adjustment program 130 (FIG. 5), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the iterative control adjustment program 130 (FIG. 5), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for determining a lithographic set point. In this case, a computer system, such as the computer system 102 (FIG. 10), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method of diagnosing in-line critical dimension control adjustments in a lithographic process, the method comprising:
    locating a control structure in a data set representing one of a chip or a kerf;
    simulating component dimensions within a region proximate to the control structure;
    determining a difference between the simulated component dimensions within the region and target component dimensions within the region;
    determining whether the difference exceeds a predetermined tolerance threshold;
    running optical proximity correction verification on an entire chip in response to the determining the difference does not exceed the predetermined tolerance threshold;
    adjusting a simulation condition in response to determining the difference exceeds the predetermined tolerance threshold; and
    repeating the simulating of the component dimensions within the region, the determining of the difference, and the determining of whether the difference exceeds the predetermined tolerance threshold in response to the adjusting of the simulation condition.

2. The computer-implemented method of claim 1, wherein the control structure is in the data set representing the chip, and wherein the simulating of the component dimensions is performed on a chip-by-chip basis.

3. The computer-implemented method of claim 1, wherein the simulating of the component dimensions includes reading target values from one of a target file or target control table.

4. The computer-implemented method of claim 3, wherein the simulating of the component dimensions is further performed using initial simulation conditions for a first chip simulation.

5. The computer-implemented method of claim 4, further comprising:
modifying the initial simulation condition for a subsequent chip simulation after the running of the optical proximity correction verification; and
simulating the component dimensions for the subsequent chip simulation using the modified initial simulation condition.

6. The computer-implemented method of claim 1, wherein the initial simulation condition includes at least one of dose or focus.

7. The computer-implemented method of claim 1, wherein the region proximate to the control structure includes a defined region around the control structure within the one of the one of the chip or the kerf.

8. A computer system comprising:
at least one computing device configured to diagnose in-line critical dimension control adjustments in a lithographic process by performing actions comprising:
locating a control structure in a data set representing one of a chip or a kerf;
simulating component dimensions within a region proximate to the control structure;
determining a difference between the simulated component dimensions within the region and target component dimensions within the region;
determining whether the difference exceeds a predetermined tolerance threshold;
running optical proximity correction verification on an entire chip in response to the determining the difference does not exceed the predetermined tolerance threshold;
adjusting a simulation condition in response to determining the difference exceeds the predetermined tolerance threshold; and
repeating the simulating of the component dimensions within the region, the determining of the difference, and the determining of whether the difference exceeds the predetermined tolerance threshold in response to the adjusting of the simulation condition.

9. The computer system of claim 8, wherein the control structure is in the data set representing the chip, and wherein the simulating of the component dimensions is performed on a chip-by-chip basis.

10. The computer system of claim 8, wherein the simulating of the component dimensions includes reading target values from one of a target file or target control table.

11. The computer system of claim 10, wherein the simulating of the component dimensions is further performed using initial simulation conditions for a first chip simulation.

12. The computer system of claim 11, further comprising:
modifying the initial simulation condition for a subsequent chip simulation after the running of the optical proximity correction verification; and
simulating the component dimensions for the subsequent chip simulation using the modified initial simulation condition.

13. The computer system of claim 8, wherein the initial simulation condition includes at least one of dose or focus.

14. The computer system of claim 8, wherein the region proximate to the control structure includes a defined region around the control structure within the one of the one of the chip or the kerf.

15. A computer program comprising program code embodied in at least one computer-readable storage medium, which when executed, enables a computer system to diagnose in-line critical dimension control adjustments in a lithographic process, the method comprising:
locating a control structure in a data set representing one of a chip or a kerf;
simulating component dimensions within a region proximate to the control structure,
wherein the simulating of the component dimensions is further performed using an initial simulation condition for a first chip simulation;
determining a difference between the simulated component dimensions within the region and target component dimensions within the region;
determining whether the difference exceeds a predetermined tolerance threshold;
running optical proximity correction verification on an entire chip in response to the determining the difference does not exceed the predetermined tolerance threshold;
adjusting a simulation condition in response to determining the difference exceeds the predetermined tolerance threshold; and
repeating the simulating of the component dimensions within the region, the determining of the difference, and the determining of whether the difference exceeds the predetermined tolerance threshold in response to the adjusting of the simulation condition.

16. The computer program of claim 15, wherein the simulation condition includes at least one of dose or focus.

17. The computer program of claim 15, wherein the simulating of the component dimensions includes reading target values from one of a target file or target control table.

18. The computer program of claim 15, further comprising:
modifying the initial simulation condition for a subsequent chip simulation after the running of the optical proximity correction verification; and
simulating the component dimensions for the subsequent chip simulation using the modified initial simulation condition.

19. The computer program of claim 15, wherein the region proximate to the control structure includes a defined region around the control structure within the one of the one of the chip or the kerf.

* * * * *